United States Patent
Wu

(10) Patent No.: US 11,289,161 B2
(45) Date of Patent: Mar. 29, 2022

(54) PCRAM ANALOG PROGRAMMING BY A GRADUAL RESET COOLING STEP

(71) Applicant: Taiwan Semiconductor Manufacturing Co., Ltd., Hsin-Chu (TW)

(72) Inventor: Jau-Yi Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/110,647

(22) Filed: Dec. 3, 2020

(65) Prior Publication Data
US 2021/0118503 A1   Apr. 22, 2021

Related U.S. Application Data

(63) Continuation of application No. 16/528,879, filed on Aug. 1, 2019, now Pat. No. 10,872,664.

(51) Int. Cl.
*G11C 13/00* (2006.01)
*G11C 11/56* (2006.01)
*H01L 45/00* (2006.01)

(52) U.S. Cl.
CPC ...... *G11C 13/0069* (2013.01); *G11C 11/5678* (2013.01); *G11C 13/0004* (2013.01);
(Continued)

(58) Field of Classification Search
CPC ............ G11C 13/0004; G11C 14/0045; G11C 14/009
See application file for complete search history.

(56) References Cited

U.S. PATENT DOCUMENTS

2006/0220071 A1* 10/2006 Kang ................. G11C 13/0004
257/248
2007/0008769 A1   1/2007 Kim et al.
(Continued)

OTHER PUBLICATIONS

X-Ray Wizards. "Percent Crystallinity—XRD PE (Low Density) Film." The date of publication is unknown. Retrieved online on May 14, 2019 from http://www.x-raywizards.com/Services/Percent_Xtal/Application_Note_P01-crystallinity-PE.pdf.
(Continued)

*Primary Examiner* — Han Yang
(74) *Attorney, Agent, or Firm* — Eschweiler & Potashnik, LLC

(57) ABSTRACT

In some embodiments, the present disclosure relates a phase change random access memory device that includes a phase change material (PCM) layer disposed between bottom and top electrodes. A controller circuit is coupled to the bottom and top electrodes and is configured to perform a first reset operation by applying a signal at a first amplitude across the PCM layer for a first time period and decreasing the signal from the first amplitude to a second amplitude for a second time period; and to perform a second reset operation by applying the signal at a third amplitude across the PCM layer for a third time period and decreasing the signal from the third amplitude to a fourth amplitude for a fourth time period greater than the second time period. After the fourth time period, the PCM layer has a percent crystallinity greater than the PCM layer after the second time period.

20 Claims, 7 Drawing Sheets

(52) U.S. Cl.
CPC ............ *H01L 45/06* (2013.01); *H01L 45/144* (2013.01); *G11C 2013/008* (2013.01); *H01L 45/126* (2013.01)

(56) References Cited

U.S. PATENT DOCUMENTS

| | | | |
|---|---|---|---|
| 2009/0046499 A1* | 2/2009 | Philipp | G11C 16/3431 |
| | | | 365/163 |
| 2011/0103139 A1 | 5/2011 | Kau et al. | |
| 2013/0300509 A1 | 11/2013 | Kim et al. | |
| 2017/0263317 A1 | 9/2017 | Kim et al. | |
| 2020/0051628 A1 | 2/2020 | Joo et al. | |
| 2020/0167638 A1* | 5/2020 | Rummens | G06N 3/063 |

OTHER PUBLICATIONS

Wikipeda.org. "Crystallinity." Published on Jun. 11, 2018.
University of South Carolina Upstate."Polymer Chemistry—Polymer Density." Published on Jul. 21, 2000.
Non-Final Office Action dated May 11, 2020, for U.S. Appl. No. 16/528,879.
Notice of Allowance dated Aug. 20, 2020, for U.S. Appl. No. 16/528,879.

\* cited by examiner

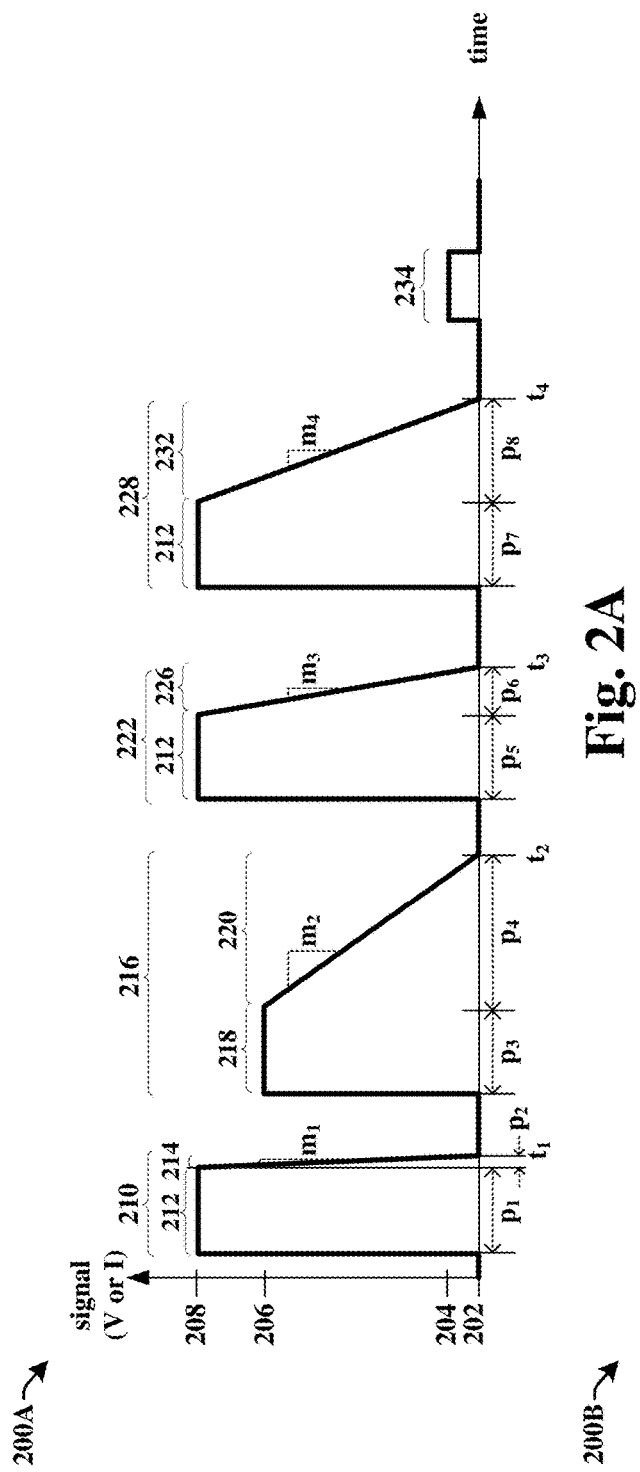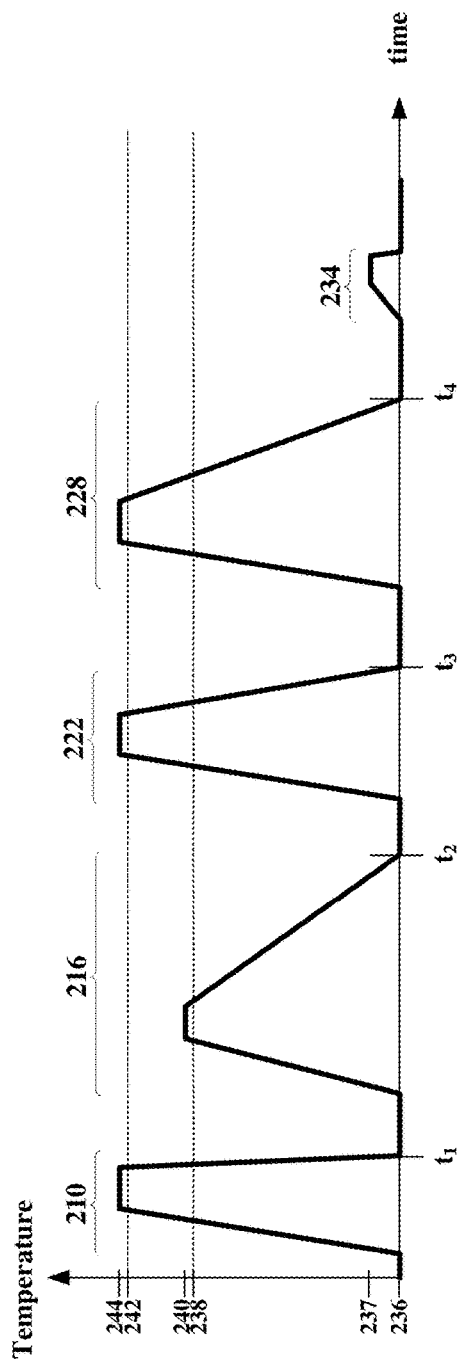

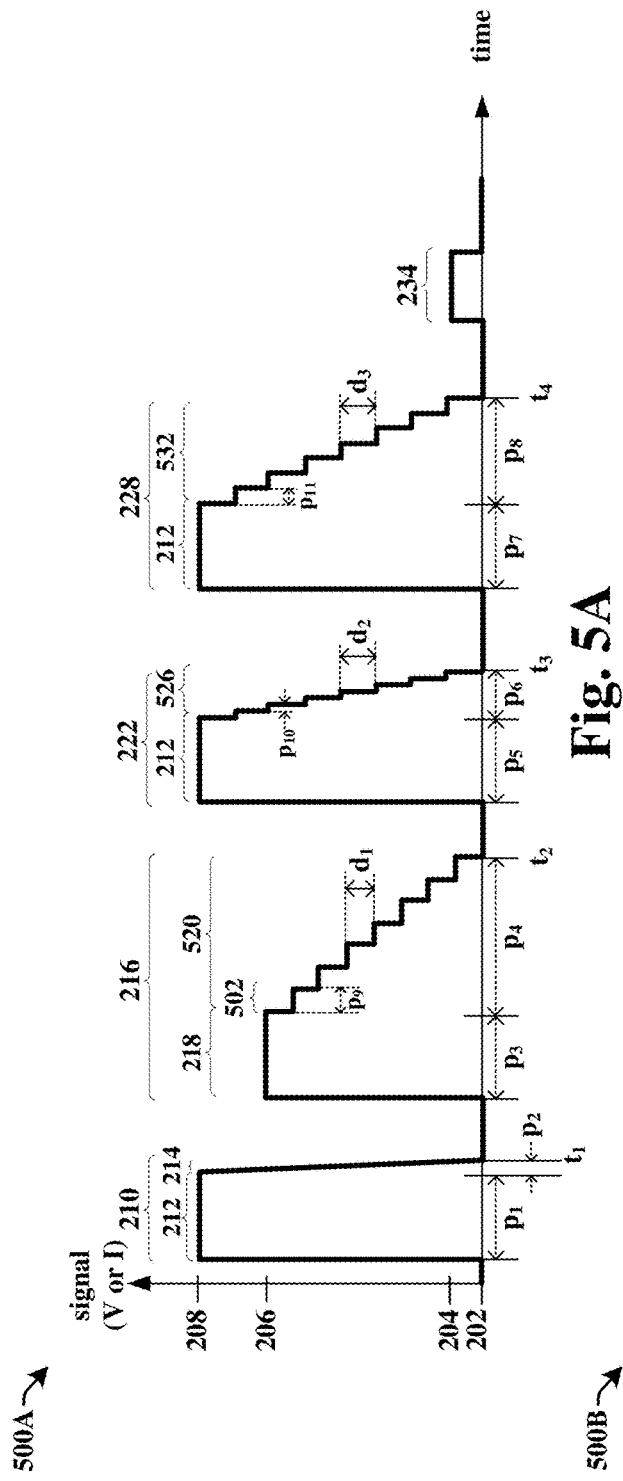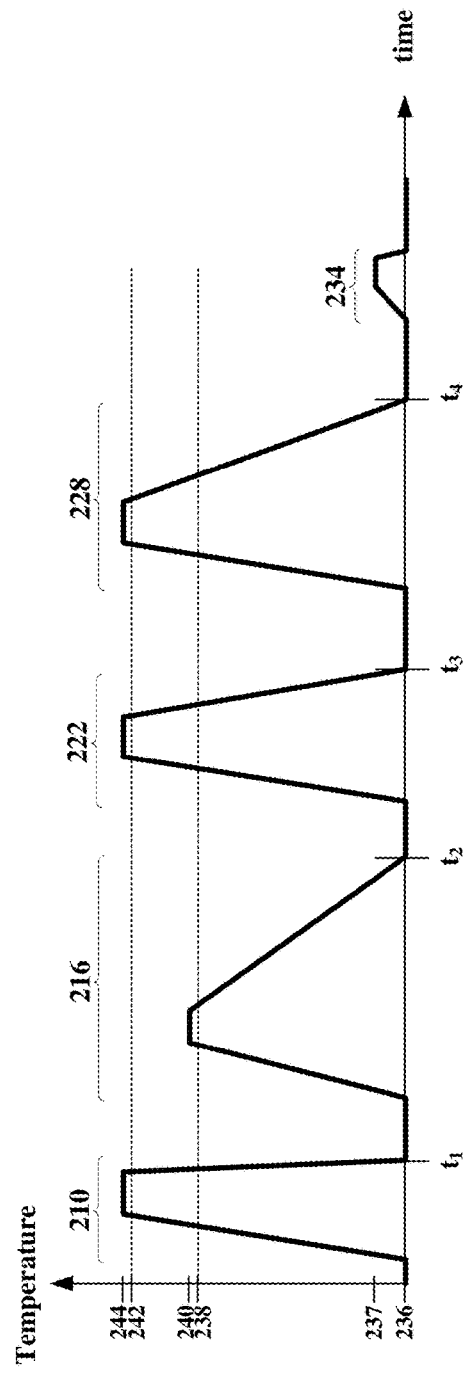

PCRAM ANALOG PROGRAMMING BY A GRADUAL RESET COOLING STEP

REFERENCE TO RELATED APPLICATION

This Application is a Continuation of U.S. application Ser. No. 16/528,879, filed on Aug. 1, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Phase-change random-access memory (PCRAM) devices are a type of non-volatile memory that are promising candidates for the next generation of non-volatile electronic memory as PCRAM devices provide faster speeds and lower power consumption while maintaining low manufacturing costs compared to other commonly used non-volatile memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a schematic of some embodiments of a timing diagram of signal amplitude versus time for a hard reset operation, a set operation, and embodiments of gradual reset operations having constant, decreasing rates during gradual cooling steps.

FIG. 2B illustrates a schematic of some embodiments of a timing diagram of temperature versus time that corresponds to the timing diagram in FIG. 2A.

FIG. 5A illustrates some embodiments of a timing diagram of signal amplitude versus time for a hard reset operation, a set operation, and embodiments of gradual reset operations having a stair-shaped waveform during a gradual cooling step.

FIG. 5B illustrates a schematic of some embodiments of a timing diagram of temperature versus time that corresponds to the timing diagram in FIG. 5A.

DETAILED DESCRIPTION

Figure 1:
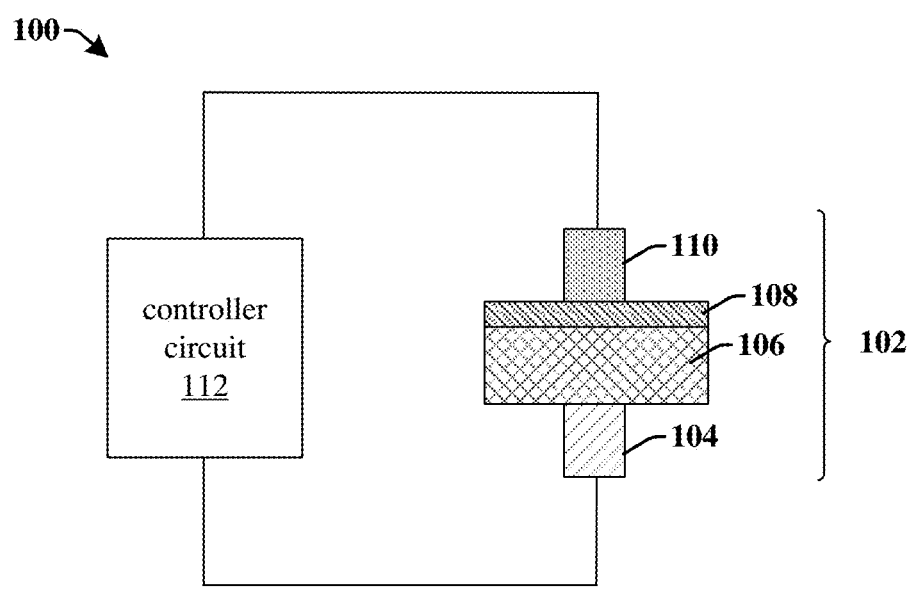
FIG. 1 illustrates a cross-sectional view of some embodiments of a phase change random access memory (PCRAM) cell coupled to a controller circuit.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phase change random access memory (PCRAM) devices generally comprise a phase change material (PCM) layer arranged between top and bottom electrodes coupled to control circuitry. PCRAM devices are configured to operate based upon a process of reversible switching between resistive states. The reversible switching is enabled by changing the phase of the PCM layer, which comprises a structure that may change phase between amorphous and crystalline based on, for example, temperature change sequences via joule heating. Joule heating involves the heat that is produced during the flow of an electric current through a conductive material. As current flows through the bottom electrode that is susceptible to joule heating, the temperature of the PCM layer is increased. As the PCM layer changes phase from crystalline to amorphous, for example, due to heating and cooling sequences controlled by, for example, applied voltage biases from the control circuitry, the resistance of the PCM layer changes from low to high, respectively.

The process of reversible switching between resistive states comprises a set operation and a reset operation, which utilize different heating and cooling techniques. The set and reset operations write data to the PCRAM cell. The reset operation applies a signal (e.g., current or voltage) at a first amplitude to the PCRAM cell to heat the PCM layer to a first temperature above its melting point, and then the signal is reduced to quickly cool (e.g., quench) the PCM layer to a second temperature. After the reset operation, the PCM layer has an amorphous structure corresponding to a high resistive state. The set operation applies a signal (e.g., current or voltage) at a third amplitude to the PCRAM cell to heat the PCM layer to a third temperature that is between its glass transition temperature and its melting point, and then the signal is slowly reduced to slowly cool the PCM layer, relative to the quick cool (e.g., quench) in the reset operation. After the set operation, the PCM layer has a crystalline structure corresponding to a low resistive state. A PCRAM cell having a first (e.g., high) resistive state corresponds to a first data value (e.g., a logical '0'), and a PCRAM cell having a second (e.g., low) resistive state corresponds to a second data value (e.g., a logical '1'). When a read signal (e.g., current or voltage) is applied to the PCRAM cell to perform a read operation, a read resistance is detected, indicating the low resistive state corresponding to the second data value (e.g., a logical '1') or the high resistive state corresponding to the first data value (e.g., a logical '0'). However, only a first data value and a second data value may be written onto and read from a PCRAM cell using the aforementioned set and reset operations.

Various embodiments of the present disclosure provide a method of performing a gradual reset operation to achieve analog programming of a PCRAM cell, thereby improving the memory capabilities of a PCRAM device. The first step of the gradual reset operation applies a signal at a first amplitude to the PCRAM cell to heat the PCM layer to a first temperature above its melting point. The signal is applied at the first amplitude for a first time period such that the PCM layer is melted. The second step of the gradual reset operation is to gradually reduce the signal from the first amplitude to a second amplitude to cool the PCM layer. The gradual reduction of the signal is conducted over a second time period that is greater the aforementioned quick cool (e.g., quench) but less than the aforementioned slow cool. By performing the gradual reset operation, the resistive state of the PCRAM cell may be carefully controlled to store more than the first data value (e.g., a logical '0') and the second data value (e.g., a logical '1'). The gradual reset operation may write, for example, a high resistive state corresponding to a first data value (e.g., logical '00'), a low resistive state corresponding to a second data value (e.g., logical '11'), and one or more intermediate resistive states corresponding to one or more additional data values (e.g., a first intermediate resistive state corresponding to a logical '01' and a second intermediate resistive state corresponding logical '10') onto the PCRAM cell. The intermediate resistive states may correspond to the PCM layer having, for example, a partially amorphous and partially crystalline structure. The more gradual the change is in resistive states, the easier it is to control the structure of the PCM layer and therefore, the easier it is to distinguish between resistive states and determine the data value stored in the PCRAM cell during a read operation. Thus, the gradual reset operation may be adjusted to reliably read and write data values onto a PCRAM cell without substantially changing the reset operation programming and without changing the manufactured structure of the PCRAM cell.

FIG. 1 illustrates a cross-sectional view 100 of some embodiments of a PCRAM cell coupled to a controller circuit.

The cross-sectional view 100 includes a PCRAM cell 102 comprising a phase change material (PCM) layer 106 disposed over a bottom electrode 104. In some embodiments, the PCRAM cell 102 comprises a top electrode 110 disposed over the PCM layer 106. In some embodiments, a capping layer 108 is disposed directly over and contacts the PCM layer 106. In some embodiments, the PCM layer 106 comprises a chalcogenide material, which is an alloy comprising an element of the VI group, combined with elements in the IV and/or V groups. Thus, in some embodiments, the PCM layer 106 may comprise, for example, $Ge_2Sb_2Te_5$ (GST), ScSbTe, GeTe, InSb, $Sb_2Te_3$, $Sb_{70}Te_{30}$, GaSb, InSbTe, GaS-eTe, $SnSbTe_4$, InSbGe, AgInSbTe, $Te_{81}Ge_{15}Sb_2S_2$, GeSbTe, SnSbTe, GeSbSe, GeSbTe, or the like.

In some embodiments, a controller circuit 112 is coupled to the bottom electrode 104 and the top electrode 110 of the PCRAM cell 102. The controller circuit 112 is configured to apply various signals (e.g., current or voltage) across the PCRAM cell 102 to change the resistive state of the PCM layer 106 by inducing different degrees of crystallinity in the PCM layer 106. A degree of crystallinity of the PCM layer 106 may be quantified as a percent crystallinity. Percent crystallinity of a material may be calculated, in some embodiments, by comparing the known densities of the material when fully amorphous and when fully crystalline with the measured density of the material. In some embodiments, the percent crystallinity of a material may be measured by X-ray diffraction or differential scanning calorimetry. In some embodiments, if a material has a percent crystallinity of 40 percent, it is understood that 40 percent of the volume of the material has a crystalline structure, whereas 60 percent of the volume of the material has an amorphous structure.

Thus, in some embodiments, the controller circuit 112 is configured to apply various waveforms to the PCRAM cell 102 to store multiple bits in PCM layer 106 of the PCRAM cell 102. These waveforms can change the degree of crystallinity in the PCM layer 106 and thus, can control a change in the resistance of the PCM layer 106 between a high-resistive state, a low-resistive state, and at least one intermediate resistive state; and can also read the present resistive state stored in the PCM layer 106 to determine what data state is in the PCRAM cell 102. In some embodiments, the controller circuit 112 is configured to supply a current to the PCRAM cell 102, whereas in other embodiments, the controller circuit 112 is configured to apply voltage biases across the PCRAM cell 102.

FIG. 2A shows an example waveform 200A for a hard reset operation, a set operation, gradual reset operations, and a read operation; and FIG. 2B shows a corresponding temperature curve 200B for the PCM layer in the PCRAM cell.

To write a first data value (e.g., a logical '00') onto a PCRAM cell (102 of FIG. 1), a hard reset operation 210 in FIG. 2A may comprise a melting pulse 212 and a hard reset cooling step 214. During the melting pulse 212 of the hard reset operation 210, the controller circuit (112 of FIG. 1) applies the signal (e.g., current or voltage) with a first amplitude 208 to heat the PCM layer (106 of FIG. 1) to a first temperature 244 above its melting point 242 to melt or liquefy the PCM layer during a first time period $p_1$. For example, in some embodiments, the signal may be an applied current, and the first amplitude 208 may be greater than 512 microamps. In other embodiments, the signal may be, for example, an applied voltage, and the first amplitude 208 may be in a range of between approximately 1.3 volts and approximately 1.5 volts. Then, during the hard reset cooling step 214, the signal is reduced to a second amplitude 202 during a second time period $p_2$ to quickly cool (e.g., quench) the PCM layer to a second temperature 236, thereby solidifying the PCM layer. In some embodiments, the second temperature 236 is equal to an ambient temperature (e.g., room temperature). In some embodiments, the second amplitude 202 may be equal to zero, such that after a first time $t_1$ the signal is no longer applied. In other embodiments, the second amplitude 202 may be greater than zero. In some embodiments, the second time period $p_2$ is less than 5 nanoseconds. In yet other embodiments, the second time period $p_2$ is less than 2 nanoseconds. In some embodiments, the second time period $p_2$ is predetermined. Thus, in some embodiments, the second time period $p_2$ is less than the first time period $p_1$. By quenching the PCM layer, the PCM layer cools to establish an amorphous structure, such that after the hard reset operation 210, the PCM layer is cooled, a solid, and has a majority (e.g., greater than 50 percent) amorphous structure with a first degree of crystallinity corresponding to a high resistive state at a first time $t_1$. Thus, in some embodiments, at the first time $t_1$ the PCM layer has a high resistance within a first resistance range, indicating the first data value. In some embodiments, after the hard reset operation 210, the PCM layer is 100 percent amorphous and 0 percent crystalline. In other embodiments, the PCM layer at the first time $t_1$ may have a first degree of crystallinity in a first crystallinity range of between approximately 0.09 percent crystalline and approximately 0.1 percent crystalline. In such other embodiments, the PCM layer may have a resistance of approximately 1 megaohms at the first time $t_1$.

To write a second data value (e.g., a logical '11') onto a PCRAM cell (102 of FIG. 1), a set operation 216 may comprise a heating pulse 218 and a set cooling step 220. During the heating pulse 218 of the set operation 216, the controller circuit (112 of FIG. 1) applies the signal (e.g., current or voltage) with a third amplitude 206 to heat the PCM layer (106 of FIG. 1) to a third temperature 240 that, in some embodiments, is between its glass transition temperature 238 and its melting point 242. In other embodiments, the third amplitude 206 may heat the PCM layer to a temperature that is above the melting point 242. In some embodiments, the heating pulse 218 is conducted over a third time period $p_3$ that is equal to the first time period $p_1$. In other embodiments, the third time period $p_3$ may be greater than the first time period $p_1$. During the set cooling step 220, the signal is slowly reduced to slowly cool the PCM layer, relative to the hard reset cooling step 214 (e.g., quench), to the ambient temperature (e.g., room temperature) over a fourth time period $p_4$. By slowly cooling the PCM layer, the PCM layer may have time to crystallize, such that after the set operation 216, the PCM layer has a majority crystalline structure (e.g., greater than 50 percent) with a second degree of crystallinity corresponding to a low resistive state at a second time $t_2$. Thus, in some embodiments, at the second time $t_2$, the PCM layer has a low resistance within a second resistance range, indicating the second data value. The second resistance range does not overlap with the first resistance range. The second degree of crystallinity is greater than the first degree of crystallinity. For example, in some embodiments, the second degree of crystallinity of the PCM layer at the second time $t_2$ may be in a second crystallinity range of between approximately 80 percent crystalline and approximately 100 percent crystalline. The second crystallinity range does not overlap with the first crystallinity range. In other embodiments, the second degree of crystallinity of the PCM layer at the second time $t_2$ may be greater than 90 percent crystalline. In such other embodiments, the PCM layer may have a resistance of approximately 10 kilohms at the second time $t_2$.

In some embodiments, a third data value (e.g., a logical '01') corresponding to a first intermediate resistive state may be written onto a PCRAM cell by a first gradual reset operation 222. The first gradual reset operation 222 may comprise the melting pulse 212 and a first gradual reset cooling step 226. The melting pulse 212 of the first gradual reset operation 222 may be the same as the melting pulse 212 of the hard reset operation 210, wherein the controller circuit (112 of FIG. 1) applies the signal (e.g., current or voltage) with the first amplitude 208 to heat the PCM layer (106 of FIG. 1) to the first temperature 244 above its melting point 242 to melt or liquefy the PCM layer (106 of FIG. 1) during a fifth time period $p_5$. In some embodiments, the fifth time period $p_5$ is equal to the first time period $p_1$. During the first gradual reset cooling step 226, the signal is reduced from the first amplitude 208 to the second amplitude 202 to cool the PCM layer during a sixth time period $p_6$ to the ambient temperature (e.g., room temperature), thereby solidifying the PCM layer. In some embodiments, the sixth time period $p_6$ may be greater than 5 nanoseconds. The sixth time period $p_6$ may be greater than the second time period $p_2$ but less than the fourth time period $p_4$ to induce a third degree of crystallinity that is greater than first degree of crystallinity but less than the second degree of crystallinity. Thus, at a third time $t_3$, the PCM layer may have a partially amorphous and a partially crystalline structure that corresponds to the first intermediate resistive state, which has a resistance that is between the low resistive state and the high resistive state of the PCRAM cell. In some embodiments, at the third time $t_3$, the PCM layer has a first intermediate resistive state within a first intermediate resistance range that does not overlap with either of the first resistance range of the second resistance range. Thus, in some embodiments, at the third time $t_3$, the PCM layer may have a percent crystallinity that is greater than 1 percent. For example, in some embodiments, at the third time $t_3$, the PCM layer may have a percent crystallinity in a third crystallinity range of between approximately 10 percent crystalline and approximately 50 percent crystalline. In other embodiments, at the third time $t_3$, the PCM layer may have a percent crystallinity in a third crystallinity range of between approximately 20 percent and approximately 40 percent. In yet other embodiments, the PCM layer may have a percent crystallinity at the third time $t_3$ that is in a third crystallinity range of between approximately 9 percent crystalline and approximately 10 percent crystalline, which may correspond to the PCM layer having a resistance of approximately 100 kilohms, for example. Nevertheless, the third crystallinity range does not overlap with either of the first crystallinity range or the second crystallinity range.

In some embodiments, a fourth data value (e.g., a logical '10') corresponding to a second intermediate resistive state may be written onto a PCRAM cell by a second gradual reset operation 228. The second gradual reset operation 228 may comprise the melting pulse 212 and a second gradual reset cooling step 232. The melting pulse 212 of the second gradual reset operation 222 may occur over a seventh time period $p_7$ and may be the same as the melting pulse 212 of the hard reset operation 210. Thus, in some embodiments, the seventh time period $p_7$ may equal the first time period $p_1$. During the second gradual reset cooling step 232, the signal is reduced from the first amplitude 208 to the second amplitude 202 to cool the PCM layer (106 of FIG. 1) during an eighth time period $p_8$ to the ambient temperature (e.g., room temperature), thereby solidifying the PCM layer. The eighth time period $p_8$ may be greater than the second time period $p_2$, greater than the sixth time period $p_6$, but less than the fourth time period $p_4$ to induce a fourth degree of crystallinity that is greater than first degree of crystallinity, greater than the third degree of crystallinity, but less than the second degree of crystallinity. Thus, at a fourth time $t_4$, the PCM layer may have a partially amorphous and a partially crystalline structure that corresponds to a second intermediate resistive state that may be between the low intermediate resistive state and the first intermediate resistive state of the PCRAM cell. In some embodiments, at the fourth time $t_4$, the PCM layer has a second intermediate resistance within a second intermediate resistance range, indicating the fourth data value. The fourth resistance range does not overlap with the first resistance range, the second resistance range, or the first intermediate resistance range. Thus, in some embodiments, at the fourth time $t_4$, the PCM layer may have a percent crystallinity that is greater than 1 percent. For example, in some embodiments, at the fourth time $t_4$, the PCM layer may have a percent crystallinity in a fourth crystallinity range of between approximately 40 percent and approximately 80 percent. In other embodiments, for example, at the fourth time $t_4$, the PCM layer may have a percent crystallinity in a fourth crystallinity range of between approximately 50 percent and approximately 70 percent. In yet other embodiments, the PCM layer may have a percent crystallinity at the fourth time $t_4$ that is in a fourth crystallinity range of between approximately 18 percent crystalline and approximately 20 percent crystalline, which may correspond to the PCM layer having a resistance of approximately 50 kilohms, for example. Nevertheless, the fourth crystallinity range does not overlap with the first crystallinity range, the second crystallinity range, or the third crystallinity range.

In some embodiments of a gradual reset operation (e.g., 222, 228), a time period of a gradual reset cooling step (e.g., 226, 232) may be less than a time period of a melting pulse (e.g., 212). For example, in some embodiments of the first gradual reset operation 222, the sixth time period $p_6$ may be less than the fifth time period $p_5$. In such embodiments, the fifth time period $p_5$ may be in a range of between approximately 10 nanoseconds and approximately 10 microseconds, whereas the sixth time period $p_6$ may be in a range of between approximately 5 nanoseconds and approximately 300 nanoseconds. In other embodiments of a gradual reset operation (e.g., 222, 228), a time period of a gradual reset cooling step (e.g., 226, 232) may be greater than a time period of a melting pulse (e.g., 212). For example, in some embodiments of the second gradual reset operation 228, the eighth time period $p_8$ may be greater than the seventh time period $p_7$. In such embodiments, the seventh time period $p_7$ may be in a range of between approximately 10 nanoseconds and approximately 15 nanoseconds, whereas the eighth time period $p_8$ may be in a range of between approximately 15 nanoseconds and approximately 300 nanoseconds.

A read operation 234, in some embodiments, comprises reading a resistive state of a PCRAM cell by applying the signal at a fourth amplitude 204 to a third temperature 237 that is below the glass transition temperature 238 of the PCM layer such that the structure and therefore the resistive state of the PCM layer do not change during the read operation 234. Thus, the controller circuit (112 of FIG. 1) may apply the signal at the fourth amplitude 204 to the PCRAM cell (102 of FIG. 1) and read a data state stored onto the PCM layer (106 of FIG. 1) by determining the resistive state of the PCRAM cell at the fourth amplitude 204.

It will be appreciated that in some embodiments, more or less than four data values may be written onto a PCRAM cell by adjusting a time period (e.g., $p_6$, $p_8$) of a gradual cooling step (e.g., 226, 232) of a gradual reset operation (e.g., 214, 232) to achieve analog programming. In some embodiments, to increase the resistive state in a PCM layer using a gradual reset operation, the degree of crystallinity may be decreased by decreasing the time period of the gradual cooling step. To decrease the resistive state in a PCM layer using a gradual reset operation, the degree of crystallinity may be increased by increasing the time period of the gradual cooling step. Thus, while the amplitudes of the various waveforms may also be adjusted, it is the differences in time periods of the cooling step (e.g., 214, 220, 226, and 232) that correspond to differences in degrees of crystallinity for the PCRAM cell, and hence result in different resistances and different stored data states. Further, it will be appreciated that the hard reset operation 210, the set operation 216, the first gradual reset operation 222, the second gradual reset operation 228 and the read operation 234 may occur in any order or any number of times, depending on what data state is to be written onto or read from a PCRAM cell. Nevertheless, by adjusting a time period (e.g., $p_6$, $p_8$) of a gradual cooling step (e.g., 226, 232) of a gradual reset operation (e.g., 214, 232), a degree of crystallinity of the PCM layer may be controlled to accurately and precisely write a desired data state onto the PCRAM cell.

In some embodiments, a rate of signal reduction versus time may be a constant, linear decrease in signal amplitude versus time. In some embodiments, the rate of signal reduction versus time may affect the degree of crystallinity in a PCM layer, and therefore resistive state in a PCRAM cell. For example, in some embodiments, a first rate $m_1$ of the hard reset operation 210 is greater than that of a second rate $m_2$ of the set operation 216, a third rate $m_3$ of the first gradual reset operation 222, and the fourth rate $m_4$ of the second gradual reset operation 228. In some embodiments, the second rate $m_2$ is the slowest rate of signal reduction versus time compared to the reset operations (e.g., 210, 222, 228). Slowing the rate of signal reduction versus time may increase the degree of crystallinity in the PCM layer, thereby decreasing the resistive state of the PCRAM cell. Further, in some embodiments, because the rate of signal reduction versus time, as illustrated in FIG. 2A, is constant and linear, the rate of temperature reduction versus time, as illustrated in FIG. 2B, may also be constant and linear.

Figure 3:
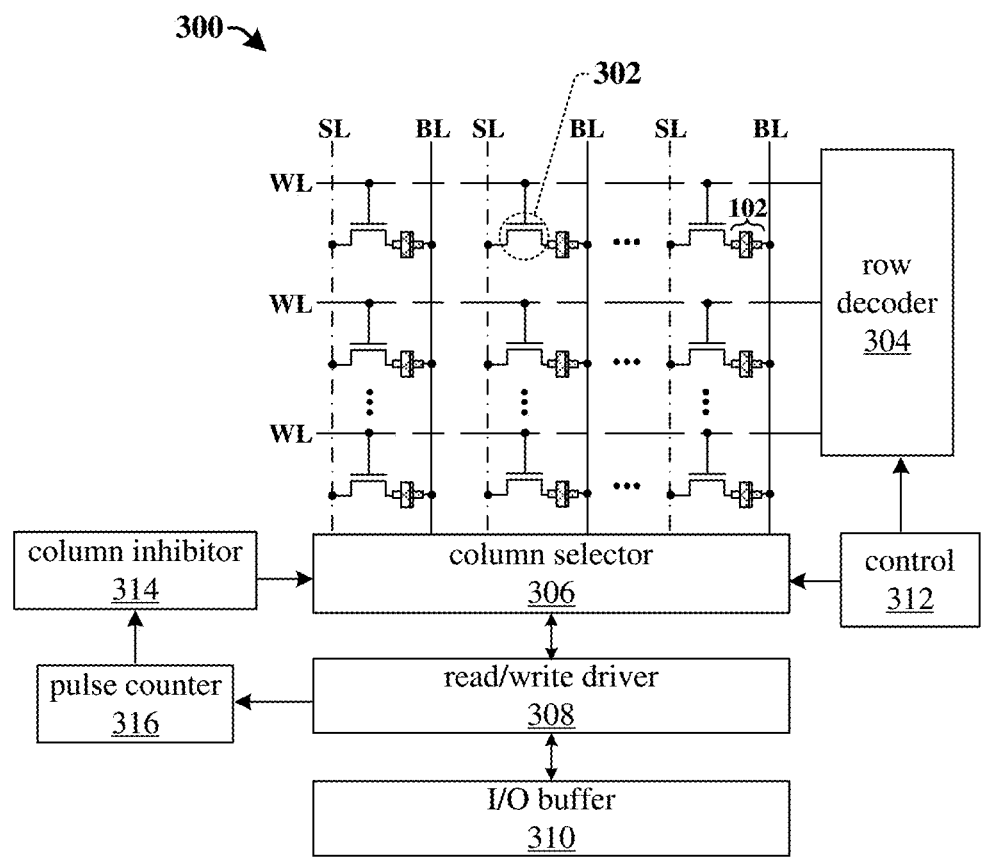
FIG. 3 illustrates a schematic of some embodiments of a PCRAM array comprising column and row circuitry configured to perform set and gradual reset operations to PCRAM cells on the PCRAM array.

FIG. 3 illustrates a schematic 300 of some embodiments of a PCRAM array.

The schematic 300 includes many rows and columns of PCRAM cells 102 of FIG. 1 coupled to transistors 302. Each transistor 302 has a gate that controls the power state (e.g., on/off) of the transistor 302, where the gate is controlled by a word-line WL coupled to a row decoder 304. Each PCRAM cell 102 and corresponding transistor 302 is coupled to a column selector 306 via a source-line SL and a bit-line BL. A control 312 is coupled to the row decoder 304 and the column selector 306. In some embodiments, the control 312 sends an address and a command (e.g., read or write) to the row decoder 304 and the column selector 306. If the command indicates writing, then the control 312 may also send data to be written onto a PCRAM cell 102. The address allows the row decoder 304 and the column selector 306 to select a specific word-line WL, source-line SL, and bit-line BL, thereby selectively accessing a specific PCRAM cell 102.

In some embodiments, the column selector 306 may be coupled to a read/write driver 308 and/or an input/output (I/O) buffer 310. The read/write driver 308 may receive the command that indicates reading or writing from the control 312, and then the read/write driver 308 may perform read or write operations onto the specific PCRAM cell 102 accessed by the column selector 306 and the row decoder 304. Thus, the read/write driver 308 may apply signals at different amplitudes to the specific word-line WL and the specific bit-line BL to perform the read or write operations of FIG. 2A. The I/O buffer 310 may be coupled to the control 312 to briefly hold data for processing. For example, in some embodiments, in a write operation, the I/O buffer 310 may briefly hold the data to be written while the address is being processed by the column selector 306 and the row decoder 304.

In some embodiments, the schematic 300 may further include a pulse counter 316 and a column inhibitor 314 coupled to the read/write driver 308 and the column selector 306. The pulse counter 316 may count or keep track of how many read and write operations have been conducted on the specific PCRAM cell 102. In some embodiments, the column inhibitor 314 may, for example, inhibit selection of a column after a certain number has been reached from the pulse counter 316. The transistors 302, the row decoder 304, the column selector 306, the read/write driver 308, the I/O buffer 310, the control 312, the column inhibitor 314, and the pulse counter 316 are all possible components that make up the controller circuit 112 of FIG. 1, in some embodiments.

In some embodiments, to perform a reset operation (e.g., 210, 222, 228 of FIG. 2A) or a set operation (e.g., 216 of FIG. 2A) to a PCRAM cell 102, the read/write driver 308 is configured to apply a signal (e.g., current or voltage) at various amplitudes for various time periods across the specific bit-line BL and specific source-line SL to access the specific PCRAM cell 102 to write a data value onto the specific PCRAM cell 102.

Figure 4:
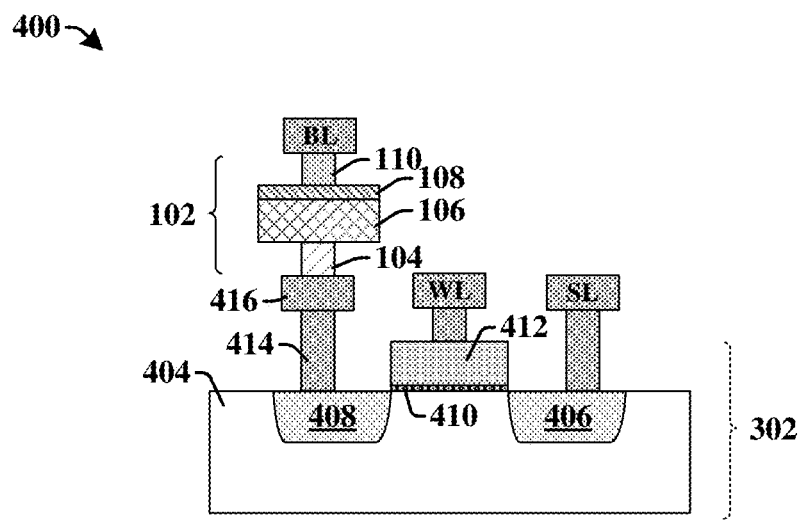
FIG. 4 illustrates some embodiments of a cross-sectional view of an integrated chip comprising a PCRAM cell coupled to a transistor.

FIG. 4 illustrates a cross-sectional view 400 of some embodiments of an integrated chip comprising a PRAM cell coupled to a transistor.

The integrated chip in the cross-sectional view 400 comprises a transistor 302. The transistor 302 comprises a source 406 and a drain 408 disposed within a substrate 404. Above the substrate 404 and between the source 406 and the drain 408 is a gate electrode 412. A gate dielectric layer 410 may separate the gate electrode 412 from the substrate 402. In some embodiments, the source 406 is coupled to a source-line SL through an interconnect via 414. In some embodiments, the source-line SL may be an interconnect wire 416. In some embodiments, the gate electrode 412 is coupled to a word-line WL, and the drain 408 may be coupled to the PCRAM cell 102. The PCRAM cell 102 may be coupled to a bit-line BL. In some embodiments, the bit-line BL is directly coupled to a top electrode 110 of the PCRAM cell 102. In other embodiments, interconnect vias 414 and interconnect wires 416 may couple the top electrode 110 of the PCRAM cell 102 to the bit-line BL.

In some embodiments, a bottom electrode 104 of the PCRAM cell 102 may comprise a conductive material that is capable of joule heating. The bottom electrode 104 may comprise, for example, copper, titanium nitride, tantalum nitride, or the like. In some embodiments, the top electrode 110 may comprise a conductive material such as, for example, copper, aluminum, titanium nitride, tantalum nitride, or the like. Thus, in some embodiments, the top electrode 110 and the bottom electrode 104 may comprise different materials, whereas in other embodiments, the top electrode 110 and the bottom electrode 104 may comprise materials that are the same. In some embodiments, a capping layer 108 of the PCRAM cell 102 may comprise, for example, silicon, an oxide, silicon nitride, silicon oxynitride, silicon carbide, or the like.

FIG. 5A shows an example timing diagram 500A for of some alternative embodiments of a hard reset operation, a set operation, gradual reset operations having stair-shaped cooling steps, and a read operation; and FIG. 5B shows a corresponding temperature curve 500B for the PCM layer in the PCRAM cell.

The timing diagram 500A of FIG. 5A and the corresponding temperature curve 500B of FIG. 5B includes a hard reset operation 210 and a read operation 234 that may comprise the same characteristics as the hard reset operation 210 and the read operation 234 in FIGS. 2A and 2B. In some embodiments, the set operation 216 comprises a heating pulse 218 and a set stair-shaped cooling step 520. The heating pulse 218 of FIG. 5A may comprise the same characteristics as the heating pulse 218 of FIG. 2A. The set stair-shaped cooling step 520 reduces the signal (e.g., current or voltage) from the third amplitude 206 to the second amplitude 202 over the fourth time period $p_4$, such that at the second time $t_2$, the PCM layer (106 of FIG. 1) may have a substantially crystalline structure. However, instead of a having a constant, linear reduction in signal over time like the set cooling step 220 in FIG. 2A, in some embodiments, the set stair-shaped cooling step 520 comprises multiple quench increments 502. In FIG. 5A, the set stair-shaped cooling step 520 comprises seven quench increments 502. In other embodiments, the set stair-shaped cooling step 520 may comprise less than or greater than seven quench increments 502. Each quench increment 502 of the set stair-shaped cooling step 520 involves a decrease in the amplitude of the signal by a first difference $d_1$, and then a holding of the signal for a ninth time period $p_9$. In some embodiments, the first difference $d_1$ between each quench increment 502 of the set stair-shaped cooling step 520 is substantially the same, and the ninth time period $p_9$ of each quench increment 502 of the set stair-shaped cooling step 520 is substantially the same. In some embodiments, although a waveform of the set stair-shaped cooling step 520 exhibits a stair-shaped shape, the temperature reduction versus time of the set operation 216 in FIG. 5B may be constant and linear due to heat dissipation effects. In other embodiments, the temperature reduction versus time of the set operation 216 may also exhibit a stair-shaped or jagged shape (not shown). Nevertheless, at the second time $t_2$, the PCM layer may have the second degree of crystallinity that corresponds to a low resistive state of the PCRAM cell.

In some embodiments, the first gradual reset operation 222 comprises the melting pulse 212 and a first gradual stair-shaped cooling step 526. The melting pulse 212 may comprise the same characteristics as the melting pulse 212 of FIG. 2A. The first gradual stair-shaped cooling step 526 may reduce the signal from the first amplitude 208 to the second amplitude 202 over the sixth time period $p_6$ to write the first intermediate resistive state onto the PCRAM cell. However, instead of having a constant, linear reduction in signal over time, in some embodiments, the first gradual stair-shaped cooling step 526 may comprise multiple quench increments 502. Each quench increment 502 of the first gradual stair-shaped cooling step 526 involves a decrease in the amplitude of the signal by a second difference $d_2$, and then a holding of the signal for a tenth time period $p_{10}$. Each quench increment 502 increases the percent crystallinity in the PCM layer and therefore reduces the resistance of the PCM layer compared to each preceding quench increment 502. In some embodiments, a total number of the quench increments 502 of the first gradual stair-shaped cooling step 526 may be less than or equal to seven, and the tenth time period $p_{10}$ and/or the second difference $d_2$ may be adjusted. Nevertheless, at the third time $t_3$, the PCM layer may have the third degree of crystallinity that corresponds to the first intermediate resistive state of the PCRAM cell.

In some embodiments, the second gradual reset operation 228 comprises the melting pulse 212 and a second gradual stair-shaped cooling step 532. The melting pulse 212 may comprise the same characteristics as the melting pulse 212 of FIG. 2A. The second gradual stair-shaped cooling step 532 may reduce the signal from the first amplitude 208 to the second amplitude 202 over the eighth time period $p_8$ to write the second intermediate resistive state onto the PCRAM cell. However, instead of having a constant, linear reduction in signal over time, in some embodiments, the second gradual stair-shaped cooling step 532 may comprise multiple quench increments 502. Each quench increment 502 of the second gradual stair-shaped cooling step 532 involves a decrease in the amplitude of the signal by a third difference $d_3$, and then a holding of the signal for a eleventh time period $m_1$. In some embodiments, a total number of the quench increments 502 of the second gradual stair-shaped cooling step 532 may be less than or equal to seven, and the eleventh time period $p_{11}$ and/or the third difference $d_3$ may be adjusted. Nevertheless, at the fourth time $t_4$, the PCM layer may have the fourth degree of crystallinity that corresponds to the second intermediate resistive state of the PCRAM cell.

In some embodiments, the first degree of crystallinity, the second degree of crystallinity, the third degree of crystallinity, and the fourth degree of crystallinity may be about equally spaced apart from one another. For example, in some embodiments, the high resistive state may correspond to the first degree of crystallinity, which may be in a range of between approximately 0 percent crystalline and 10 percent crystalline; the first intermediate resistive state may correspond to the third degree of crystallinity, which may be in a range of between approximately 23 percent crystalline and approximately 43 percent crystalline; the second intermediate resistive state may correspond to fourth degree of crystallinity, which may be in a range of between approximately 56 percent crystalline and approximately 76 percent crystalline, and the low resistive state may correspond to the second degree of crystallinity, which may be in a range of between approximately 90 percent crystalline and approximately 100 percent crystalline. In other embodiments, the first degree of crystallinity, the second degree of crystallinity, the third degree of crystallinity, and the fourth degree of crystallinity may not be evenly spaced apart from one another. In some embodiments, a first ratio of resistances between two resistive states may correspond to a second ratio of percent crystallinities corresponding to the two resistive states. For example, if a high resistive state corresponds to 1 megaohms and a low resistive state corresponds to 10 kilohms, the first ratio between the high resistive state resistance and the low resistive state resistance may be 100. The high resistive state may correspond to the first degree of crystallinity of, for example between 90 and 100 percent crystalline, whereas the low resistive state may correspond to the second degree of crystallinity of, for example, 0.09 and 0.1 percent crystallinity. Thus, the second ratio between the low percent crystallinity corresponding to the high resistive state and the high percent crystallinity corresponding the low resistive state may be equal to $1/100$, which corresponds to an inversion of the first ratio. Further, in such embodiments, the first intermediate resistive state may correspond to the third degree of crystallinity, which may be in a range of between approximately 9 percent crystalline and 10 percent crystalline, corresponding to a resistance of approximately 100 kilohms, for example. In such embodiments, the second intermediate resistive state may correspond to the fourth degree of crystallinity, which may be in a range of between approximately 18 percent crystalline and 28 percent crystalline, corresponding to a resistance of approximately 50 kilohms, for example.

In some embodiments, the tenth time period $p_{10}$ of the first gradual stair-shaped cooling step 526 and the eleventh time period $p_{11}$ of the second gradual stair-shaped cooling step 532 may each be in a range of between approximately 1 nanosecond and approximately 40 nanoseconds. Thus, in some embodiments, the tenth time period $p_{10}$ and the eleventh time period $p_{11}$ may be less than the fifth time period $p_5$ and the seventh time period $p_7$, respectively. The first and second gradual stair-shaped cooling steps 526, 532 may be classified as a slow quench because the sixth time period $p_6$ and the eighth time period $p_8$ may each be greater than 5 nanoseconds. As the sixth time period $p_6$ and/or the eighth time period $p_8$ are increased, which are influenced by the number of quench increments 502, the time periods (e.g., $p_{10}$, $p_{11}$) of each quench increment 502, and the difference (e.g., $d_2$, $d_3$) in amplitude of each quench increment 502, the degree of crystallinity in the structure of the PCM layer (106 of FIG. 1) may increase, thereby allowing for intermediate resistive states to be written onto the PCRAM cell in order to achieve analog programming.

Figure 6A:
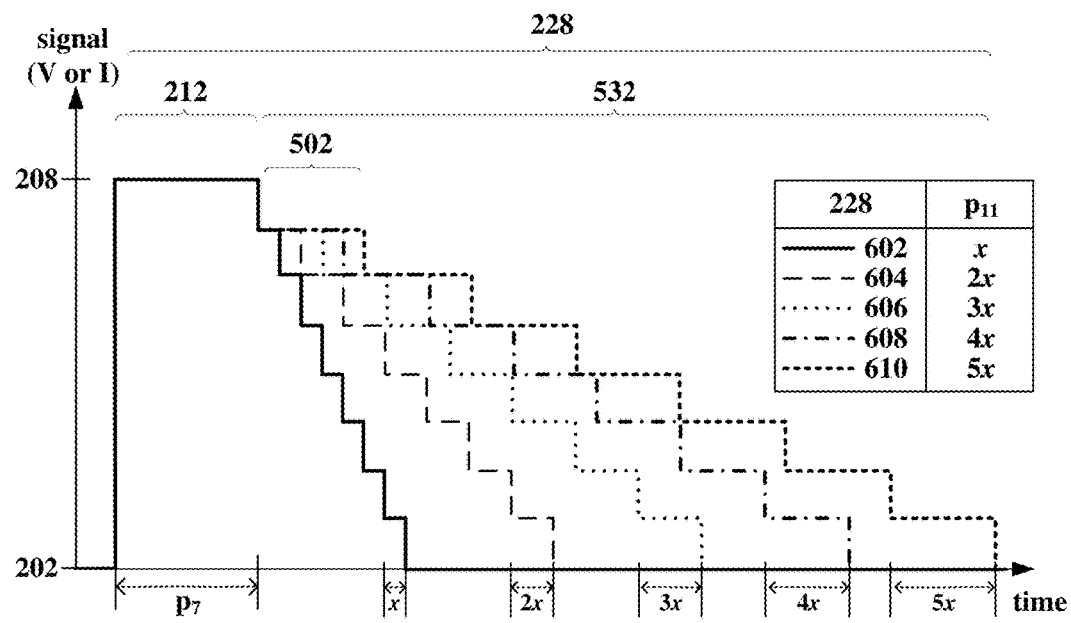
FIGS. 6A and 6B illustrate some embodiments of plots that represent the effects of resistance versus signal amplitude when increasing a second time period of the gradual cooling step in a gradual reset operation.

FIG. 6A illustrates a timing diagram 600A of some further embodiments of a method of performing a gradual reset operation using a stair-shaped cool. The timing diagram 600A represents signals applied over time to the PCRAM cell (102 of FIG. 1) by the controller circuit (112 of FIG. 1).

Five different variations of, for example, the second gradual reset operation 228 are plotted on the timing diagram 600A. Each of the second gradual reset operations 228 have a same melting step 212 held for a seventh time period $p_7$ at a first amplitude 208. Further, each of the second gradual stair-shaped cooling steps 532 utilize seven quench increments 502, but have different eleventh time periods ($p_{11}$ of FIG. 5A). For example, a first data line 602 has an eleventh time period $p_{11}$ relatively equal to "x." A second data line 604 has an eleventh time period $p_{11}$ relatively equal to "2x." In other words, each quench increment 502 of the second data line 604 is held for two times as long as each quench increment 502 of the first data line 602. A third data line 606 has an eleventh time period $p_{11}$ relatively equal to "3x." A fourth data line 608 has an eleventh time period $p_{11}$ relatively equal to "4x." A fifth data line 610 has an eleventh time period $p_{11}$ relatively equal to "5x." Thus, the first data line 602 has the fastest second gradual stair-shaped cooling step (532 of FIG. 5A), and the fifth data line 610 has the slowest second gradual stair-shaped cooling step (532 of FIG. 5A).

Figure 6B:
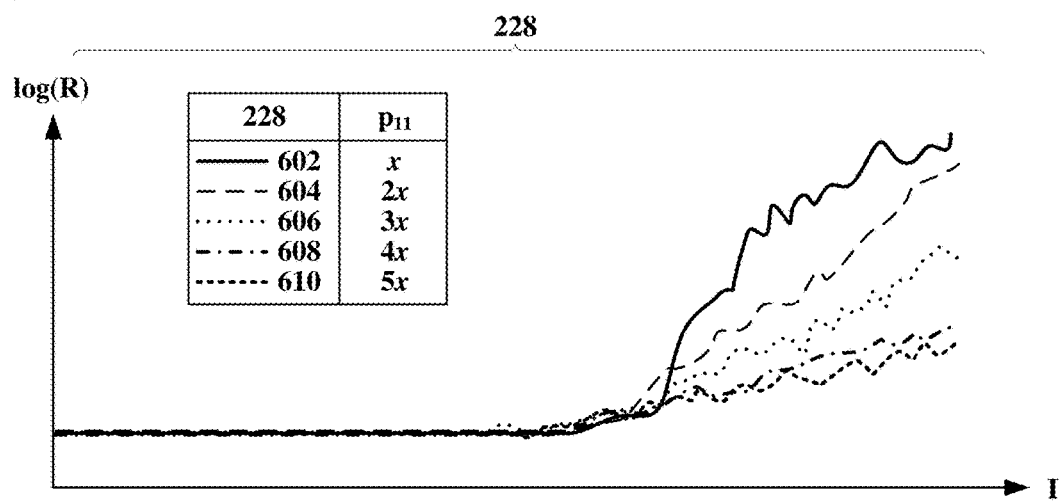

FIG. 6B illustrates a plot 600B which shows how the eleventh time period of quench increments effects resistance versus current relationship in some embodiments of a PCRAM cell (102 of FIG. 1) during each gradual reset operation of FIG. 6A.

As the signal is reduced, the PCRAM cell (102 of FIG. 1) cools and the resistance of the PCRAM cell (102 of FIG. 1) decreases. The first data line 602, the second data line 604, the third data line 606, the fourth data line 608, and the fifth data line 610 in FIG. 6B respectively correspond to the conditions of the first data line 602, the second data line 604, the third data line 606, the fourth data line 608, and the fifth data line 610 in FIG. 6A. The first data line 602 has the fastest rate of change of resistance per current, whereas the fifth data line 610 has the slowest rate of change of resistance per current. In other words, as the eleventh time period $p_{11}$ of each quench increment (502 of FIG. 5A) increases which increases the eighth time period ($p_8$ of FIG. 5A) of the second gradual stair-shaped cooling step 532, the rate of change in resistance per current decreases. In some embodiments, a low rate of change in resistance per current allows the second gradual stair-shaped cooling step (532 of FIG. 5A) to be more easily tuned to store a certain resistive state onto the PCRAM cell (102 of FIG. 1). Thus, in some embodiments, the fifth data line 610 may be more suitable for reading and writing multiple data states onto a PCRAM cell (102 of FIG. 1) to achieve analog programming than the first data line 602.

Figure 7:
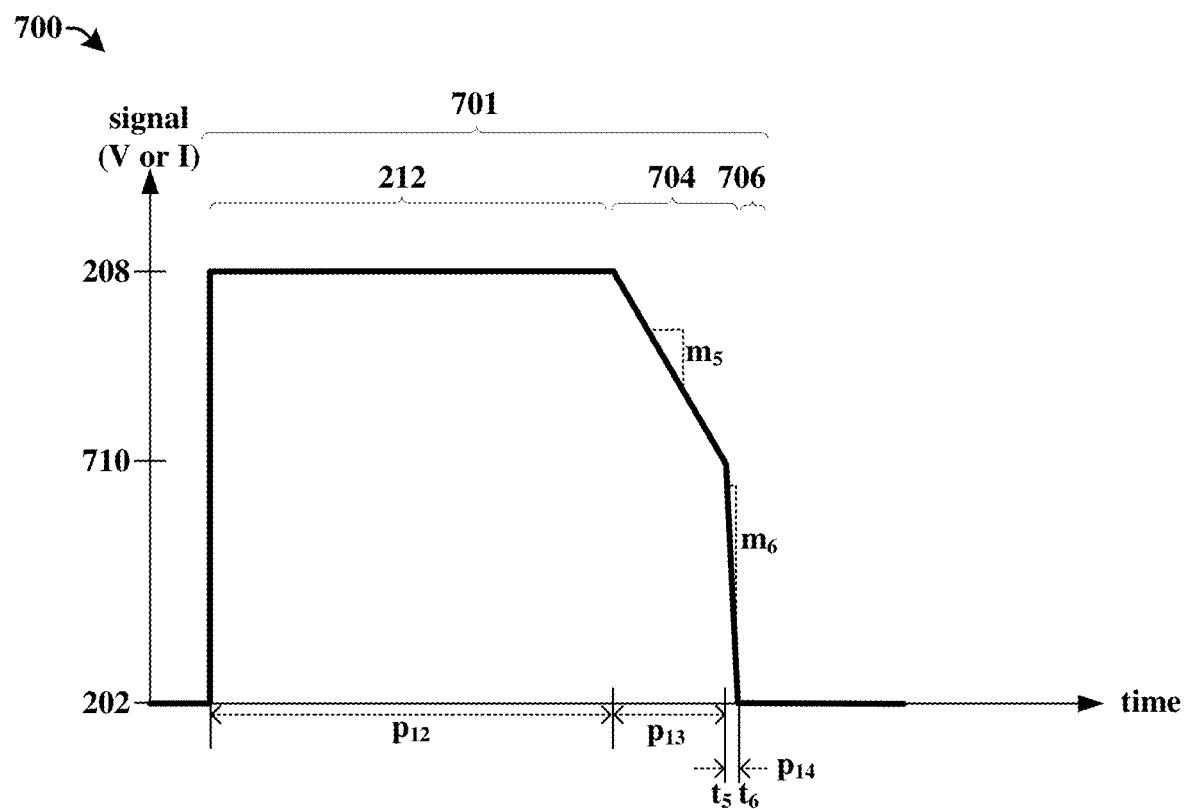
FIG. 7 illustrates some embodiments of a timing diagram of signal amplitude versus time to write an intermediate resistive state onto a PCRAM cell using a combination of a gradual reset operation and a hard reset operation.

FIG. 7 illustrates a timing diagram 700 of some alternative embodiments of a method of performing a combined hard and gradual reset operation to write a desired intermediate resistive state onto a PCRAM cell (102 of FIG. 1). The timing diagram 500 represents a signal applied over time to the PCRAM cell (102 of FIG. 1) by the controller circuit (112 of FIG. 1).

To write an intermediate data value to the PCRAM cell (102 of FIG. 1) associated with a desired intermediate resistive state, a combined hard and gradual reset operation 701 may be performed. The combined hard and gradual reset operation 701 in the timing diagram 700 comprises the melting step 212 followed by a gradual cooling step 704 and a hard cooling step 706. The melting step 212 may occur over a twelfth time period $p_{12}$ and comprise the same steps and characteristics as the melting step 212 in FIG. 2A. At the end of the melting step 212, the PCM layer (106 of FIG. 1) is fully melted. Then, during the gradual cooling step 704, the signal is reduced from the first amplitude 208 to a fifth amplitude 710 over a thirteenth time period $p_{13}$. In some embodiments, the fifth amplitude 710 corresponds to the desired intermediate resistive state, and is greater than zero. In some embodiments, during the gradual cooling step 704, the signal is reduced at a fifth rate $m_5$ (e.g., amplitude per time) that is constant such that the gradual cooling step 704 exhibits a waveform that is substantially linear with a negative slope. In other embodiments, the gradual cooling step 704 may comprise a signal that is reduced using multiple quench increments (502 of FIG. 5A), such that the gradual cooling step 704 exhibits a waveform that is a stair-shaped cool, as illustrated in FIG. 5A, for example.

In some embodiments, at the fifth amplitude 710, the PCM layer (106 of FIG. 1) has a structure that is majority (e.g., greater than 50 percent) amorphous with a small degree of crystallinity because during the second thirteenth period $p_{13}$, a small portion the structure of the PCM layer (106 of FIG. 1) may have had time to crystallize. Thus, in some embodiments, increasing the thirteenth time period $p_{13}$ may increase the percent of crystallization in the PCM layer (106 of FIG. 1), thereby decreasing the resistance of the PCM layer (106 of FIG. 1). Further, in some embodiments, increasing the fifth amplitude 710 may increase the resistance of the PCM layer (106 of FIG. 1).

At a fifth time $t_5$, the hard cooling step 706 may be conducted by reducing the signal from the fifth amplitude 710 to the second amplitude 202 until a sixth time $t_6$. The hard cooling step 706 occurs over a fourteenth time period $p_{14}$. In some embodiments, the fourteenth time period $p_{14}$ is less than 5 nanoseconds. In yet other embodiments, the fourteenth time period $p_{14}$ is less than 2 nanoseconds. Nevertheless, the hard cooling step 706 quenches the PCM layer (106 of FIG. 1), such that the desired intermediate resistive state is substantially maintained and stored onto the PCRAM cell (102 of FIG. 1). In some embodiments, the third amplitude 202 is equal to zero, such that at the sixth time $t_6$, the signal is no longer applied. In some embodiments, during the combined hard and gradual reset operation 701, a resistance of the PCM layer (106 of FIG. 1) may be tunable in a range of between approximately 9 kiliohms and approximately 1 megaohm.

In some embodiments, the fourteenth time period $p_{14}$ is less than twelfth first time period $p_{12}$ and is also less than the thirteenth time period $p_{13}$. The gradual cooling step 704 has the fifth rate $m_5$ defined by a difference in the first amplitude 208 and the fifth amplitude 710 over the thirteenth time period $p_{13}$, and the hard cooling step 706 has a sixth rate $m_6$ defined by a difference in the fifth amplitude 710 and the second amplitude 202 over the fourteenth time period $p_{14}$. In many embodiments, the sixth rate $m_6$ is greater than the fifth rate $m_5$. Thus, a desired intermediate resistive state of the PCRAM cell (102 of FIG. 1) may be reached by using the hard cooling step 706, and then the desired intermediate resistive state may be maintained and stored in the PCRAM cell (102 of FIG. 1) by using the hard cooling step 706 to achieve analog programming.

It will be appreciated that a combined hard and gradual reset operation 701 of FIG. 7, the first or second gradual reset operations 222, 228 of FIG. 5A having first or second gradual stair-shaped cooling steps 526, 532, and/or the first or second gradual reset operations 222, 228 having constant, linear first or second gradual cooling steps 226, 232 may be used in a combination of one another to write various data values onto a PCRAM cell. For example, in some embodiments, to write a low resistive state onto a PCRAM cell, a set operation 216 having the set stair-shaped cooling step 520 of FIG. 5A may be used; whereas to write a first intermediate resistive state onto a PCRAM cell, a first gradual reset operation 222 having the first gradual cooling step 226 of FIG. 2A may be used; and whereas to write a second intermediate resistive state onto a PCRAM cell, a combined hard and gradual reset operation 701 of FIG. 7 may be used. In other embodiments, every cooling step of the various write operations may be the same. For example, in such other embodiments, every cooling step of the various write operations may occur using a constant, linear reduction in signal over time.

Figure 8:
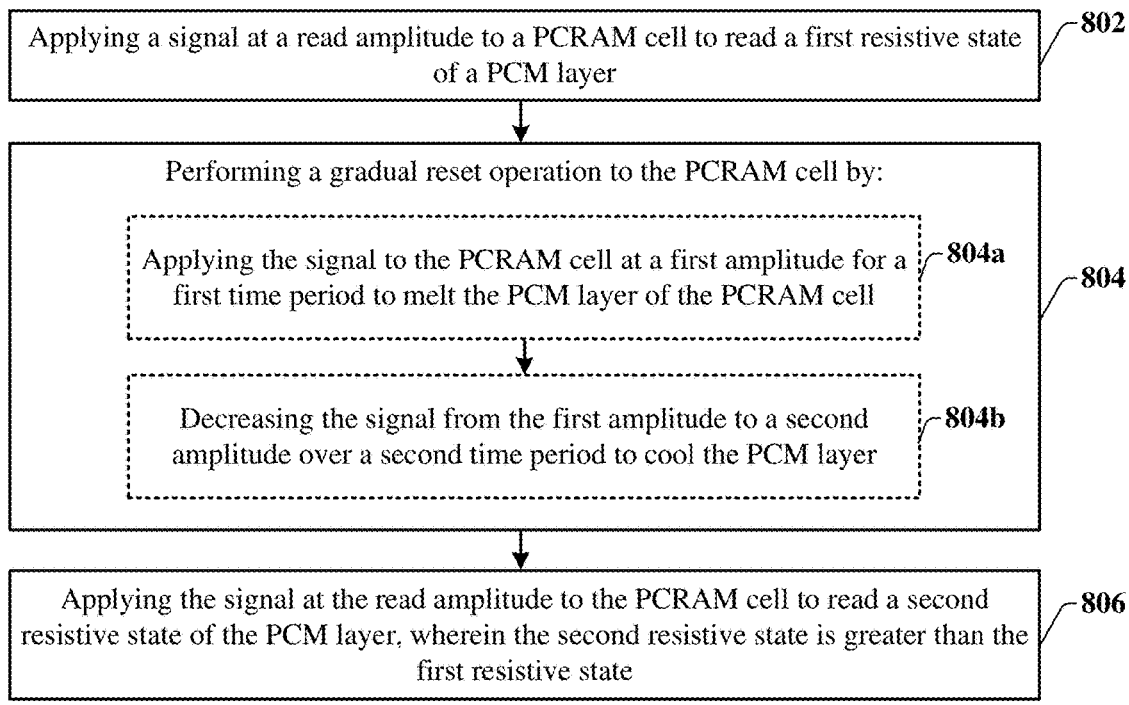
FIG. 8 illustrates a flow diagram of some embodiments of a method of performing a gradual reset operation on a PCRAM cell.

FIG. 8 illustrates a flow diagram of some embodiments of a method 800 of performing a gradual reset operation.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 802, a signal is applied at a read amplitude to a PCRAM cell to read a first resistive state of a PCM layer. FIG. 5A illustrates a timing diagram 500A of some embodiments corresponding to act 802.

At act 804, a gradual reset operation may be performed on the PCRAM cell by acts 804a and 804b.

At the act 804a, the signal is applied to the PCRAM cell at a first amplitude for a first time period to melt the PCM layer of the PCRAM cell.

At the act 804b, the signal is decreased from the first amplitude to a second amplitude over a second time period to cool the PCM layer. FIG. 5A illustrates a timing diagram 500A of some embodiments corresponding to acts 804, 804a and 804b.

At act 806, the signal at the read amplitude is again applied to the PCRAM cell to read a second resistive state of the PCM layer, wherein the second resistive state is greater than the first resistive state. FIG. 5A illustrates a timing diagram 500A of some embodiments corresponding to act 806.

Therefore, the present disclosure relates to adjusting the time period of a cooling step of a reset operation in order to increase the number of resistive states that may be accurately written onto a PCRAM cell.

Accordingly, in some embodiments, the present disclosure relates to a method of operating a phase change memory cell, comprising: writing a first data state to the phase change memory cell by heating a phase change material of the phase change memory cell to a melting point of the phase change material, thereby liquefying the phase change material, and then cooling the phase change material to an ambient temperature below the melting point of the phase change material over a first predetermined cooling time period, thereby solidifying the phase change material to correspond to the first data state; and writing a second data state to the phase change memory cell by heating the phase change material of the phase change memory cell to the melting point of the phase change material, thereby liquefying the phase change material, and then cooling the phase change material to the ambient temperature over a second predetermined cooling time period, thereby solidifying the phase change material to correspond to the second data state, the second predetermined cooling time period differing from the first predetermined cooling time period.

In other embodiments, the present disclosure relates to a method of operating a phase change random access memory (PCRAM) cell, comprising: performing a reset operation to the PCRAM cell, by: applying a signal to the PCRAM cell at a first amplitude; holding the signal at the first amplitude for a first time period to melt a phase change material (PCM) layer of the PCRAM cell; decreasing the signal from the first amplitude to a second amplitude; holding the signal at the second amplitude for a second time period; decreasing the signal from the second amplitude to a third amplitude; holding the signal at the third amplitude for a third time period; and decreasing the signal from the third amplitude to a fourth amplitude.

In yet other embodiments, the present disclosure relates to a phase change random access memory (PCRAM) device, comprising: a phase change material (PCM) layer disposed over a bottom electrode and configured to change structure between crystalline and amorphous upon temperature changes; a bit-line coupled to the PCM layer; a controller circuit coupled to the bit-line and configured to perform a reset operation by applying a signal at a first amplitude to the bit-line for a first time period to melt the PCM layer and decreasing the signal from the first amplitude to a second amplitude for a second time period to cool the PCM layer, wherein after the second time period, the PCM layer has a structure that has a percent crystallinity greater than one percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change random access memory (PCRAM) device, comprising:
    a phase change material (PCM) layer disposed between a bottom electrode and a top electrode and configured to change structure between crystalline and amorphous upon temperature changes;
    a controller circuit coupled to the top and bottom electrodes and configured to:
        perform a first reset operation to the PCRAM device by applying a signal at a first amplitude across the PCM layer for a first time period to melt the PCM layer and decreasing the signal from the first amplitude to a second amplitude for a second time period to cool the PCM layer, wherein after the second time period, the PCM layer has a structure that has a first percent crystallinity; and
        perform a second reset operation to the PCRAM device by applying the signal at a third amplitude across the PCM layer for a third time period to melt the PCM layer and decreasing the signal from the third amplitude to a fourth amplitude for a fourth time period to cool the PCM layer, wherein the fourth time period is greater than the second time period, and wherein after the fourth time period, the PCM layer has a structure that has a second percent crystallinity that is greater than the first percent crystallinity,
    wherein the decreasing of the signal during the first reset operation is conducted in multiple quench increments,
    wherein a first quench increment of the multiple quench increments comprises decreasing the signal from the first amplitude to a first intermediate amplitude and holding the signal at the first intermediate amplitude for a first quench time period,
    wherein an intermediate quench increment of the multiple quench increments comprises decreasing the signal from an intermediate amplitude to a subsequent intermediate amplitude directly following a time period for which the intermediate amplitude was held, and holding the signal at the intermediate amplitude for another quench time period, and
    wherein a final quench increment of the multiple quench increments comprises decreasing the signal from a final intermediate amplitude to the second amplitude.

2. The PCRAM device of claim 1, wherein the controller circuit is further configured to perform a set operation to the PCRAM device by applying the signal at a fifth amplitude to the PCRAM device for a fifth time period to heat the PCM layer to a temperature between a glass transition temperature and a melting temperature of the PCM layer and decreasing the signal from the fifth amplitude to a sixth amplitude over a sixth time period to cool the PCM layer of the PCRAM device, wherein the sixth time period is greater than the second and fourth time periods, and wherein the fifth amplitude is less than the first and third amplitudes.

3. The PCRAM device of claim 1, wherein the first amplitude is equal to the third amplitude.

4. The PCRAM device of claim 1, wherein the first time period is equal to the third time period.

5. The PCRAM device of claim 1, wherein the decreasing of the signal during the second reset operation is performed at a constant rate of signal reduction versus time.

6. The PCRAM device of claim 1, wherein the second amplitude is equal to the fourth amplitude.

7. A phase change random access memory (PCRAM) device, comprising:

a phase change material (PCM) layer disposed over a bottom electrode and configured to change structure between crystalline and amorphous upon temperature changes;

a bit-line coupled to the PCM layer; and a controller circuit coupled to the bit-line and configured to:

perform a reset operation by applying a signal, to the bit-line at a first amplitude, holding the signal at the first amplitude for a first time period to melt the PCM layer, decreasing the signal from the first amplitude to a second amplitude directly following the first time period, holding the signal at the second amplitude for a second time period, decreasing the signal from the second amplitude to a third amplitude directly following the second time period, holding the signal at the third amplitude for a third time period, and decreasing the signal from the third amplitude to a fourth amplitude directly following the third time period.

8. The PCRAM device of claim 1, wherein a plot of the signal versus time for the decreasing of the signal from the third amplitude to the fourth amplitude during the second reset operation exhibits a stair-shaped waveform.

9. The PCRAM device of claim 2, wherein the decreasing of the signal during the set operation is performed at a constant rate of signal reduction versus time.

10. The PCRAM device of claim 2, wherein a plot of the signal versus time for the decreasing of the signal from the fifth amplitude to the sixth amplitude during the set operation exhibits a stair-shaped waveform.

11. The PCRAM device of claim 7, wherein a difference between the first amplitude and the second amplitude is equal to a difference between the second amplitude and the third amplitude and is equal to a difference between the third amplitude and the fourth amplitude.

12. The PCRAM device of claim 7, wherein the first time period is equal to the second time period and is equal to the third time period.

13. The PCRAM device of claim 7, wherein the first time period is greater than the second and third time periods.

14. The PCRAM device of claim 7, wherein the controller circuit is further configured to perform a set operation by applying the signal at a fifth amplitude for a fifth time period to heat the PCM layer to a temperature between a glass transition temperature and a melting temperature of the PCM layer and decreasing the signal from the fifth amplitude to a sixth amplitude over a sixth time period to cool the PCM layer of the PCRAM device.

15. The PCRAM device of claim 14, wherein a sum of the first and second time periods is less than the sixth time period.

16. The PCRAM device of claim 14, wherein the fifth amplitude is less than the first amplitude and greater than the fourth amplitude.

17. A method of operating a phase change memory cell, comprising:

performing a reset operation to the phase change memory cell by applying a signal at a first amplitude to the phase change memory cell for a first time period to melt a phase change material (PCM) layer of the phase change memory cell and decreasing the signal from the first amplitude to a second amplitude for a second time period to cool the PCM layer of the phase change memory cell; and performing a set operation by applying the signal at a third amplitude to the phase change memory cell for a third time period to heat the PCM layer to a temperature between a glass transition temperature and a melting temperature of the PCM layer and decreasing the signal from the third amplitude to a fourth amplitude over a fourth time period to cool the PCM layer of the phase change memory cell, wherein the fourth time period is greater than the second time period, and wherein the third amplitude is less than the first amplitude.

18. The method of claim 17, wherein the third time period is equal to the first time period.

19. The method of claim 17, wherein after the reset operation, the PCM layer has a structure that has a first percent crystallinity, and wherein after the set operation, the PCM layer has a structure that has a second percent crystallinity that is greater than the first percent crystallinity.

20. The method of claim 17, further comprising:

performing an additional reset operation to the phase change memory cell by applying the signal at a fifth amplitude to the phase change memory cell for a fifth timer period to melt the PCM layer, decreasing the signal from the fifth amplitude to a sixth amplitude over a sixth time period to gradually cool the PCM layer, and reducing the signal from the sixth amplitude to a seventh amplitude over a seventh time period to quickly cool the PCM layer.

* * * * *